(12) United States Patent
Johnson et al.

(10) Patent No.: US 6,621,692 B1
(45) Date of Patent: Sep. 16, 2003

(54) COMPUTERIZED SYSTEM HAVING AN INTERFACE APPARATUS WITH IMPROVED MOUNTING FEATURES

(75) Inventors: Keith Johnson, Medway, MA (US); Edward Claprood, Southborough, MA (US)

(73) Assignee: EMC Corporation, Hopkinton, MA (US)

( * ) Notice: Subject to any disclaimer, the term of this patent is extended or adjusted under 35 U.S.C. 154(b) by 8 days.

(21) Appl. No.: 09/943,244

(22) Filed: Aug. 30, 2001

(51) Int. Cl.[7] ................................................ G06F 1/16
(52) U.S. Cl. ...................... 361/683; 361/686; 361/724; 312/223.1
(58) Field of Search ................................ 361/679, 683, 361/724–727; 312/223.1–223.3, 249.4, 249.11, 334.1, 334.7–334.9, 334.22–335.1

(56) References Cited

U.S. PATENT DOCUMENTS 4,686,608 A * 8/1987 Hosking ..................... 361/428
6,442,030 B1 * 8/2002 Mammoser et al. ........ 361/727

* cited by examiner

*Primary Examiner*—Darren Schuberg
*Assistant Examiner*—Yean Hsi Chang
(74) *Attorney, Agent, or Firm*—Chapin & Huang, L.L.C.; David E. Huang, Esq.

(57) ABSTRACT

A computerized system includes a chassis, computerized circuitry and an interface apparatus. The chassis has a circuit mounting portion and an interface mounting portion coupled together. The interface mounting portion includes a hinged platform. The computerized circuitry fastens to the circuit mounting portion of the chassis. The computerized circuitry has a computerized circuitry communications port. The interface apparatus has a frame that is configured to fasten to and detach from the hinged platform of the interface mounting portion of the chassis, and a console that attaches to the frame. The console includes an input device, an output device and a console communications port. The interface apparatus further includes a cable assembly having a first end that electrically connects with the console communications port and a second end that is configured to electrically connect with the computerized circuitry communications port.

25 Claims, 12 Drawing Sheets

COMPUTERIZED SYSTEM HAVING AN INTERFACE APPARATUS WITH IMPROVED MOUNTING FEATURES

BACKGROUND OF THE INVENTION

A typical computerized system (e.g., a general purpose computer system, a data storage system, etc.) includes a console that enables a user (e.g., a system administrator, a technician, etc.) to communicate with the computerized system. The console typically includes an input device (e.g., a keyboard, a mouse, etc.) that receives user commands, and an output device (e.g., a monitor) that displays information back to the user. Accordingly, the console provides the user with the capability to (i) enter commands (e.g., to configure the computerized system) as well as (ii) to confirm that the computerized system is operating properly.

One conventional data storage system includes, as the console, a laptop computer. This laptop computer (also called "the service processor") is stored within a door of a cabinet housing the data storage system. In particular, the laptop computer is fastened to a small table which is hinged directly to the cabinet door. The small table holds the laptop computer using hook and loop fastening material (i.e., VELCRO-like material). When a user (e.g., a technician) requires electronic access to the data storage system, the user opens the cabinet door, and unfolds the small table hinged to the door. The user then unfolds a small support arm from the door so that one end of the support arm pushes against the door, and the other end of the support arm pushes against the small table to support the small table and the laptop computer. A cable harness having multiple cables tightly bundled together electrically connects the laptop computer to data storage circuitry housed within the cabinet.

Occasionally the laptop computer may require replacement (e.g., due to failure or upgrading). To this end, a technician unscrews the small table (and the laptop computer fastened to the small table) from hinges which hold the small table directly to the cabinet door, and unplugs the cable harness cables (i.e., an end of the cable harness) which mate with connectors on the back and/or one or more sides of the laptop computer. The technician then plugs the cable harness cables onto a new laptop and screws on a new small table, which holds the new laptop computer, to the hinges in order to hold the new small table and the new laptop directly to the cabinet door. Alternatively, the technician unplugs the cables and rips the original laptop computer away from the small table (to overcome the hook and loop fastening material), and then plugs the cables into the new laptop computer and fastens the new laptop computer to the small table using hook and loop fastening material.

SUMMARY OF THE INVENTION

Unfortunately, there are deficiencies to the above-described approach to storing a laptop computer within a cabinet door using a small table hinged directly to a cabinet door. For example, different laptop computer manufacturers tend to locate connectors of their laptop computer designs in different locations (e.g., on the left side, on the right side, on the right-hand side of the back, etc.) making it difficult to provide a standardized cable harness end that is equipped to properly and neatly connect with the connectors of each laptop computer design. Rather, installers may find that the end of the cable harness connects well with a laptop computer from one manufacturer (e.g., with little or no slack in any of the bundled cables) but does not connect well with a laptop computer from another manufacturer (e.g., with excessive slack in some of the bundled cables, with some cables not reaching a particular connector location, etc.). Accordingly, the dependency on reusing the end of the cable harness when replacing the original laptop computer of a data storage system with a new laptop computer may limit the supplier of the data storage system to using only certain laptop computer configurations, or laptop computer manufacturers, rather than allow the supplier to freely and competitively deal with any laptop computer configuration or laptop computer manufacturer.

Furthermore, when an installer replaces the original laptop computer, the installer must either unscrew the small table holding the laptop computer from its hinges, or alternatively overcome the hook and loop fastening material holding the laptop computer to the small table by ripping the laptop computer from the small table. The awkwardness of such replacement steps, in addition to the difficulties in having to reattach the cable harness cables, requires a substantial amount of effort and time thus increasing the time and cost of replacing the laptop computer.

Additionally, in the above-described conventional approach, the support of the small table depends on the proper positioning of the support arm (e.g., properly positioning ends of the support arm against the small table and the cabinet door). If the support arm fails (e.g., slips out of position), the small table and the laptop computer may slam against the cabinet door and sustain damage. Replacement of laptop computers due to damage caused by failure (e.g., mis-positioning) of the support arm can be expensive.

Furthermore, some narrower cabinets may have cabinet doors that are narrower than a standard laptop computer. The above-described conventional approach of storing the laptop computer on a small table and in the cabinet door is unsuitable for such narrower cabinets because the laptop computers cannot fit within the narrow cabinet doors.

In contrast to the above-described conventional approach to storing a laptop computer on a small table hinged directly to a cabinet door, embodiments of the invention are directed to techniques for mounting an interface apparatus (e.g., a laptop computer coupled to a frame) that is configured to fasten to and detach from a hinged platform (e.g., a small table). Accordingly, a user (e.g., an installer) does not need to unscrew a small table from its hinges in order to replace an original laptop computer. Rather, the user can simply detach the interface apparatus from the hinged platform (e.g., slide the laptop computer and frame off of the hinged platform), and fasten a new interface apparatus in its place (e.g., slide a new laptop computer and new frame onto the hinged platform) thus saving substantial time and effort compared to the above-described conventional approach to replacing a laptop computer.

One arrangement of the invention is directed to a computerized system (e.g. a data storage system) that includes a chassis, computerized circuitry and an interface apparatus. The chassis has a circuit mounting portion and an interface mounting portion which are coupled together. The computerized circuitry fastens to the circuit mounting portion of the chassis, and has a computerized circuitry communications port. The interface mounting portion includes a hinged platform. The interface apparatus has a frame that is configured to fasten to and detach from the hinged platform of the interface mounting portion of the chassis, and a console that attaches to the frame. The console includes an input device, an output device and a console communications port. The interface apparatus further includes a cable assembly having a first end that electrically connects with the console communications port and a second end that is configured to electrically connect with the computerized circuitry communications port. A user can simply install the interface apparatus by fastening the frame to the hinged platform (e.g., by sliding the frame onto the hinged platform), or remove the interface apparatus from the hinged platform (e.g., by sliding the frame off of the hinged platform). Accordingly, no time consuming and difficult unscrewing or re-screwing of a small table at the hinges is required.

In one arrangement, the frame of the interface apparatus includes a tray and a set of threaded members (e.g., thumb screws) coupled to the tray. The tray defines (i) a surface that attaches to the console, and (ii) a set of channels to slidably engage the tray with the hinged platform of the interface mounting portion of the chassis. Accordingly, the user can simply slide the tray onto the hinged platform when installing the interface apparatus onto the computerized system, or slide the tray off of the hinged platform when detaching the interface apparatus. The user can further use the set of threaded members to lock the tray with and unlock the tray from the hinged platform of the interface mounting portion of the chassis.

In one arrangement, the cable assembly of the interface apparatus includes a set of cables and a cable carrier. The set of cables has a set of first ends that electrically connects with the communications port of the console and a set of second ends that are configured to electrically connect with the computerized circuitry communications port. The cable carrier is configured to (i) hold a mid-section of the set of cables, (ii) permit the mid-section of the set of cables to move along an X-Y plane, and (iii) restrict movement of the mid-section of the set of cables along a Z direction that is substantially perpendicular to the X-Y plane. Accordingly, the cable carrier can prevent the set of cables from bending or flexing into an undesirable position, e.g., along the opening of a cabinet door where the cables could be damaged (crushed).

In one arrangement, the cable assembly of the interface apparatus further includes a connecting member that holds the set of second ends of the set of cables, and is configured to concurrently mate each of the set of second ends with the computerized circuitry communications port. Accordingly, the supplier of the computerized system (e.g., the manufacturer) can electrically connect and disconnect the interface apparatus by mating and un-mating the set of second ends of the set of cables (e.g., at a standardized connecting interface) rather than wrestle with how the set of first ends connects with the particular connector configuration of the console (e.g., a laptop computer).

In one arrangement, the interface apparatus further includes a set of shields (e.g., plastic covers) that cover the set of first ends of the set of cables. The set of shields helps protect the set of first ends of the set of cables against damage (e.g., against tampering, dirt and debris, etc.).

In one arrangement, the interface mounting portion of the chassis further includes a support apparatus that is physically coupled to the circuit mounting portion of the chassis, and a set of friction hinges that is physically couples the hinged platform to the support apparatus. The set of friction hinges is configured to suppress rotation of the hinged platform relative to the support apparatus. Accordingly, the hinged platform (as well as the interface apparatus fastened thereto) can be prevented from inadvertently falling and sustaining damage (e.g., slamming against part of the cabinet).

In one arrangement, the chassis defines a central cavity which houses the computerized circuitry. Here, the interface mounting portion of the chassis includes a support apparatus and a set of hinges. The support apparatus has a guide that includes (i) a fixed rail that is physically coupled to the circuit mounting portion of the chassis within the central cavity defined by the chassis, and (ii) a movable rail that moves relative to the fixed rail. The set of hinges physically couples the hinged platform to the movable rail to permit the console to selectively reside in a storage location within the central cavity defined by the chassis and an operating location outside the central cavity defined by the chassis. Accordingly, the interface apparatus can be stored within the central cavity of the chassis rather than a cabinet door. This arrangement is well-suited for configurations where the interface apparatus is wider than the cabinet door.

In one arrangement, the guide of the support apparatus further includes a set of rollers disposed between the fixed rail and the movable rail to enable the movable rail to slide relative to the fixed rail. In this arrangement, the rollers can reduce friction between the fixed rail and movable rail thus making it easier to setup or put away the interface apparatus (i.e., remove the interface apparatus from the central cavity in order to operate the console, or place the interface apparatus back in the central cavity).

In one arrangement, the guide of the support apparatus further includes a plunger, coupled to the movable rail, that selectively engages and disengages with the chassis to respectively hold the movable rail in a locked position and release the movable rail from the locked position. Accordingly, the plunger can prevent the interface apparatus from inadvertently sliding out of the central cavity (e.g., if the cabinet door is accidentally left open).

In one arrangement, the interface mounting portion of the chassis further includes a bar that fastens to the hinged platform. Here, the guide of the support apparatus further includes a plate coupled to the movable rail, the plate defining a capture region that captures a portion of the bar in order to stabilize the hinged platform relative to the chassis. Accordingly, the bar can provide additional support for the hinged platform preventing the hinged platform from moving (e.g., while a user types on the input device).

The features of the invention, as described above, may be employed in electronic systems, devices and methods such as those of EMC Corporation of Hopkinton, Mass.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Embodiments of the invention are directed to techniques for mounting an interface apparatus (e.g., a laptop computer coupled to a frame) within an electronic cabinet. The interface apparatus is configured to fasten to and detach from a hinged platform (e.g., a small table). Accordingly, a user (e.g., an installer) does not need to unscrew a small table from its hinges in order to replace an original laptop computer as in the earlier-described conventional approach to replacing a laptop computer stored in an electronic cabinet. Rather, the user can simply detach the interface apparatus from the hinged platform (e.g., slide the laptop computer and frame off of the hinged platform), and fasten a new interface apparatus in its place (e.g., slide a new laptop computer and new frame onto the hinged platform) thus minimizing installation time and effort.

Figure 1:
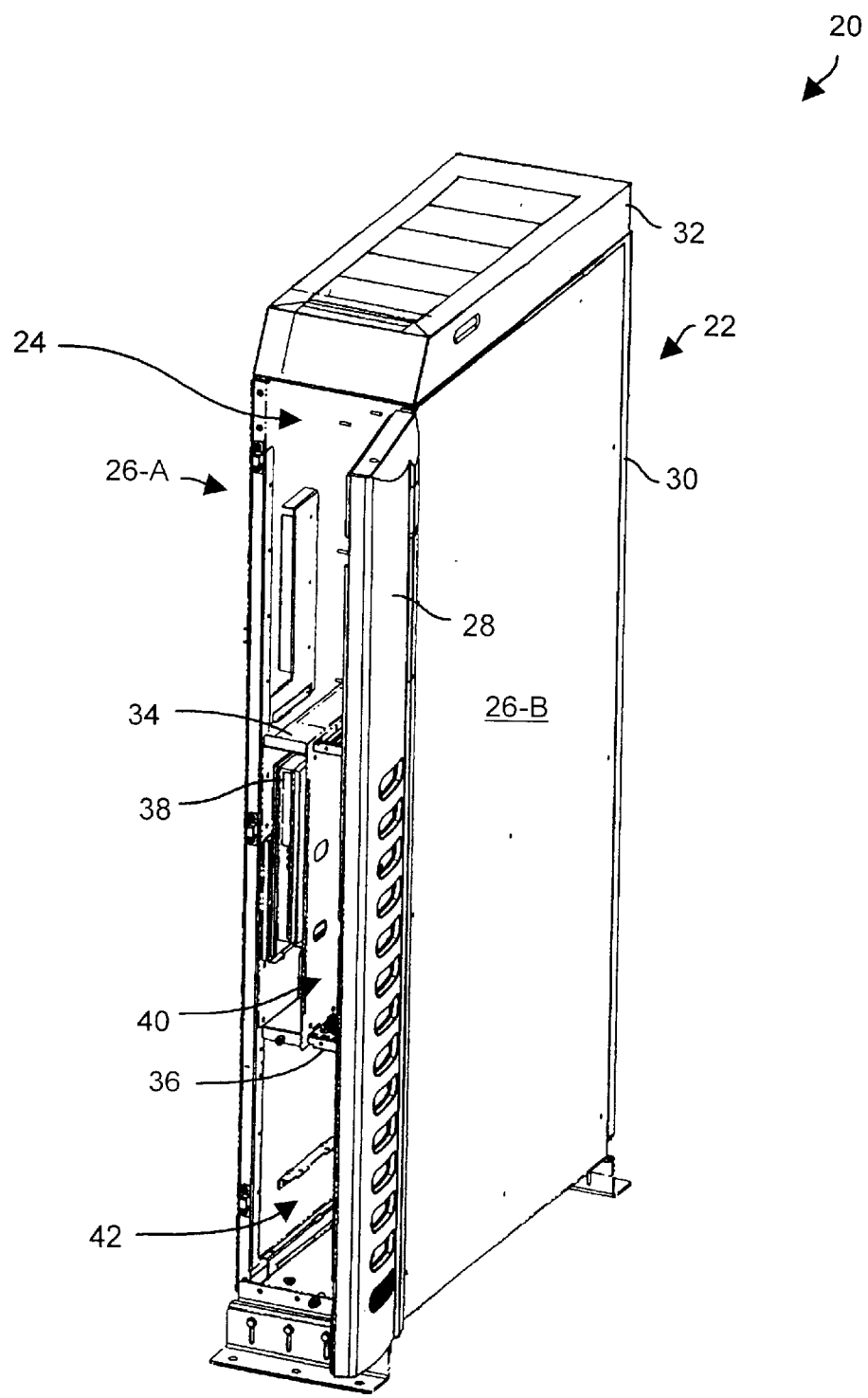
FIG. 1 shows a perspective view of a computerized system which is suitable for use by the invention.

FIG. 1 shows a computerized system 20 (e.g., a data storage system, a general purpose computer, etc.) which is suitable for use by the invention. The computerized system 20 includes a set of outer cabinet members 22 and a chassis (or cabinet frame) 24 which supports the set of outer cabinet members 22. The set of outer cabinet members 22 includes cabinet sides 26-A, 26-B, a cabinet door 28, a cabinet back 30 (e.g., another cabinet door, a panel, etc.), and a cabinet top 32 (e.g., a muffler that provides openings for air flow and that absorbs sound energy from within the cabinet). The chassis 24 includes an interface mounting portion 34 and a circuit mounting portion 36.

The computerized system 20 further includes an interface apparatus 38 that mounts to the interface mounting portion 34 of the chassis 24 (shown in a stored location in FIG. 1), and computerized circuitry 40 (generally shown in FIG. 1 as the arrow 40) that mounts to the circuit mounting portion 36 of the chassis 24. In one arrangement, the computerized circuitry 40 includes at least one processor module and at least one memory module (i.e., volatile semiconductor memory). The computerized circuitry 40 is configured to perform a series of instructions (e.g., operate as a data storage system, as a general purpose computer, etc.).

The computerized circuitry 40 includes a computerized circuitry communications port 42 (e.g., an interface formed by a set of connectors, and shown generally by the arrow 42 in FIG. 1) for connecting with the interface apparatus 38. Accordingly, a user can access the computerized circuitry 40 electronically through the computerized circuitry communications port 42 using the interface apparatus 38 in order to control (e.g., configure) the computerized system 20. Further details of the invention will now be described with reference to FIG. 2.

Figure 2:
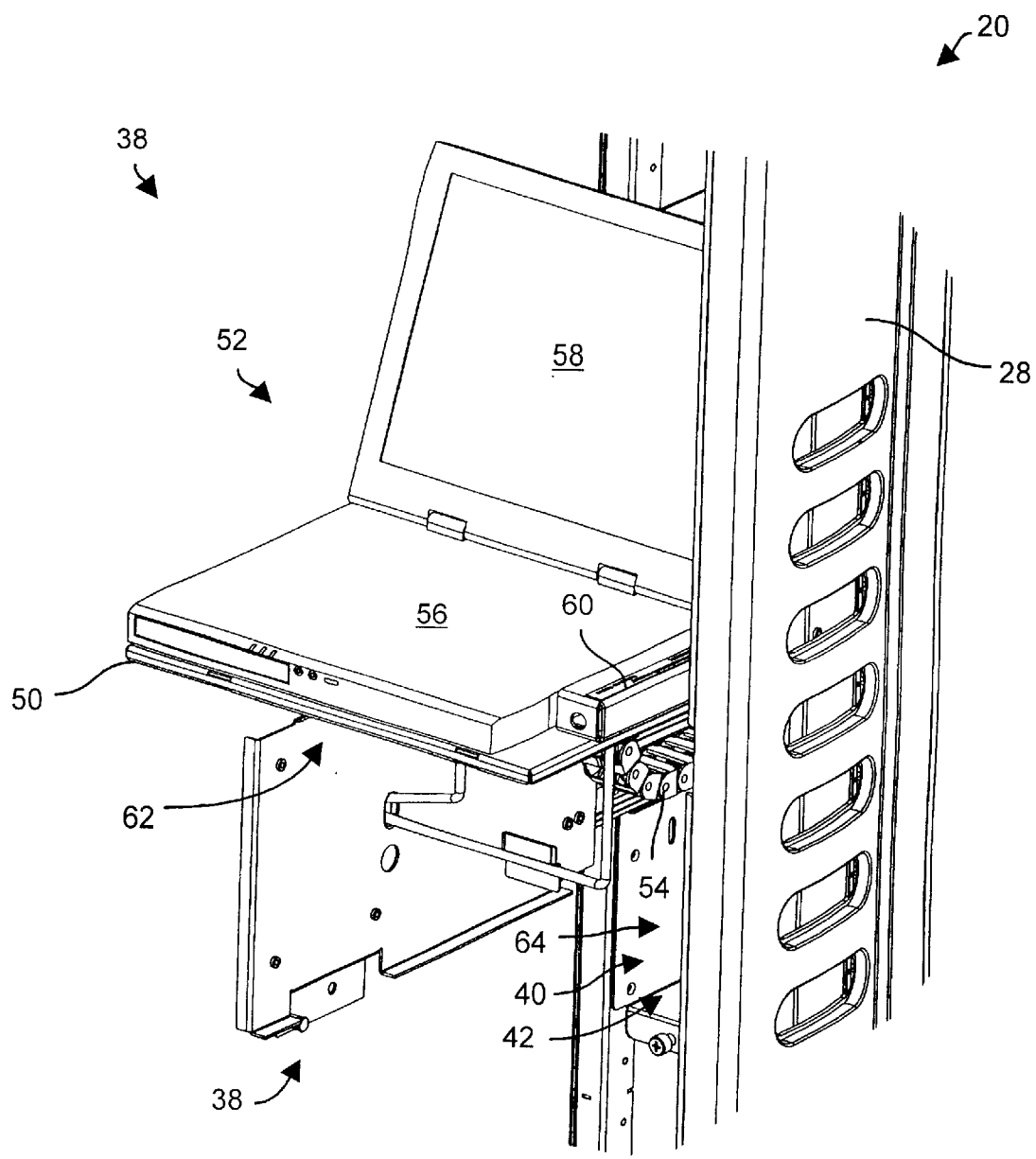
FIG. 2 shows a perspective view of an interface apparatus of the computerized system of FIG. 1.

FIG. 2 shows a perspective view of the interface apparatus 38 of the computerized system 20 when the interface apparatus 38 is set up and operational. The interface apparatus 38 includes a frame 50 (e.g., a tray-shaped structure), a console 52 (e.g., a laptop computer) and a cable assembly 54. The frame 50 attaches to the interface mounting assembly 38 of the chassis 24. The console 52 includes an input device 56 (e.g., a keyboard) for receiving input from a user, an output device 58 (e.g., a display monitor) for providing information back to the user, and a console communications port 60. The cable assembly 54 electrically connects the console communications port 60 of the console 52 with the computerized circuitry communications port 42 thus enabling the console 52 to communicate with the computerized circuitry 40.

It should be understood that the interface mounting assembly 38 of the chassis 24 includes a hinged platform 62 (shown generally by the arrow 62 in FIG. 2). The hinged platform 62 supports and couples with the frame 50 of the interface apparatus 38. As such, a user can detach the interface apparatus 38 from the hinged platform 62 (e.g., slide the laptop computer and frame 50 off of the hinged platform 62), and fasten a new interface apparatus 38 in its place (e.g., slide a new laptop computer and new frame 50 onto the hinged platform 62) in a short period of time and with little effort compared to the earlier-described conventional approach to replacing a laptop computer in a conventional system. Further details of the invention will now be provided with reference to FIG. 3.

Figure 3:
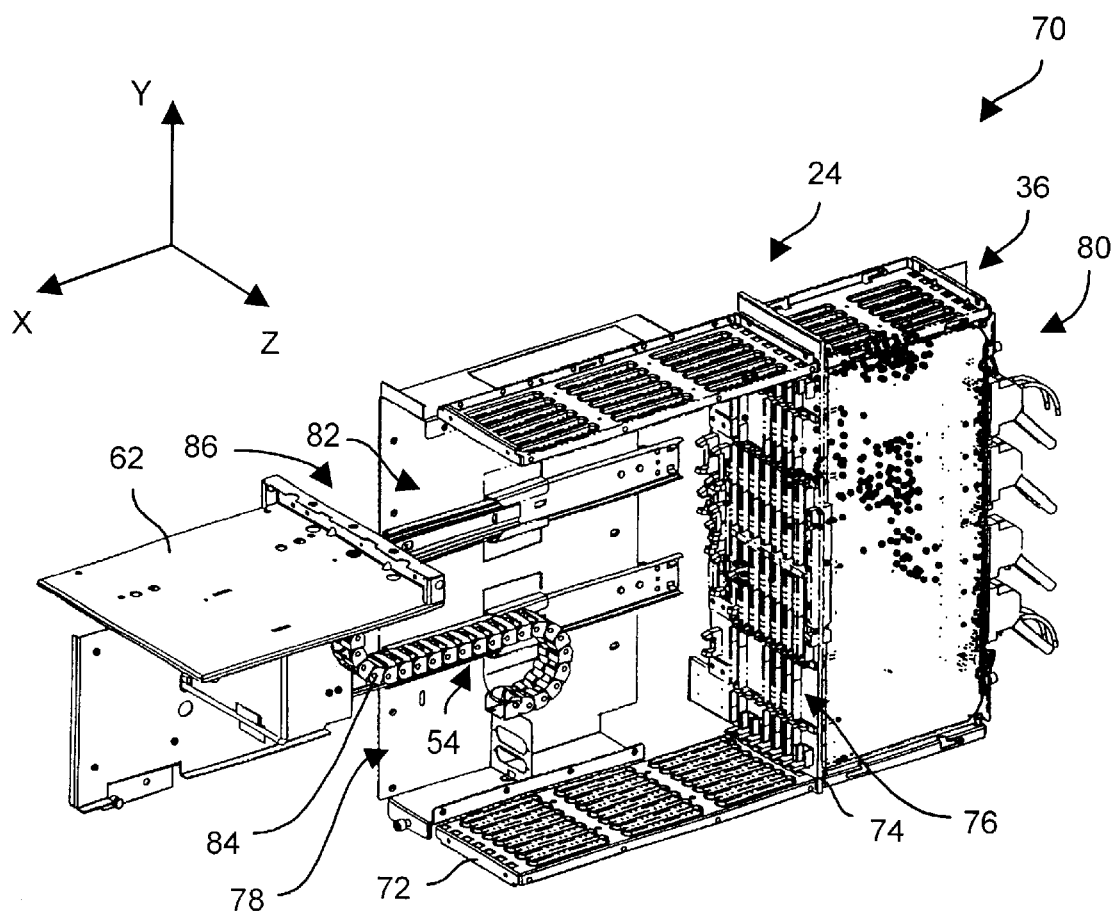
FIG. 3 shows a perspective view of a portion of a chassis of the computerized system of FIG. 1.

FIG. 3 shows a portion 70 of the chassis 24 of the computerized system 20. By way of example only, the circuit mounting portion 36 of the chassis 20 includes a card cage 72 for holding the computerized circuitry 36 (e.g., circuit boards, disk drive assemblies, etc.), and a backplane 74 that connects the computerized circuitry 36 together. The backplane 74 includes a set of connectors 76 for electrically connecting with the computerized circuitry 36.

As shown in FIG. 3 and by way of example only, the card cage 72 is configured to receiving the computerized circuitry 36 on two sides 78, 80. However, in FIG. 3, no computerized circuitry 36 is shown on the side 78 in order to illustrate particular details of the computerized system 20. In particular, it should be understood that the hinged platform 62 slides out and unfolds from of a central cavity 82 defined by the chassis 24. The cable assembly 54 includes a chain-like outer carrier or harness 84 (e.g., a series of linked segments) that permits the cable assembly 54 to significantly move in along a plane (e.g., the X-Y plane) but prevents the cable assembly 54 from moving in a direction (e.g., the Z direction) which is substantially perpendicular to that plane. Accordingly, the cable assembly 54 is unlikely to bend awkwardly into a location where it would be susceptible to damage (e.g., where it could be crushed by a user closing the cabinet door 28, see FIG. 1). In particular, the cable carrier 84 can prevent the set of cables housed therein from bending or-flexing into an undesirable position where the cables could be damaged (e.g., cut).

It should be understood that the hinged platform 62 provides a planar surface which is substantially along the X-Z plane of FIG. 3. As will be explained shortly, the interface apparatus 38 is configured to mount with the hinged platform 62 by sliding along the X-Z plane and thus engage the hinged platform 62. To this end, the hinged platform 62 includes a set of holes 86 which are capable of receiving a set of threaded members of the interface apparatus 38. Accordingly, a user can simply install the interface apparatus 38 by fastening the frame 50 to the hinged platform 62 (e.g., by sliding the frame 50 onto the hinged platform 62), or remove the interface apparatus 38 from the hinged platform 62 (e.g., by sliding the frame 50 off of the hinged platform 62). As a result, no time consuming and difficult unscrewing or re-screwing of a small table at the hinges is required as in the earlier-described conventional system. Further details of the invention will now be described with reference to FIG. 4.

Figure 4:
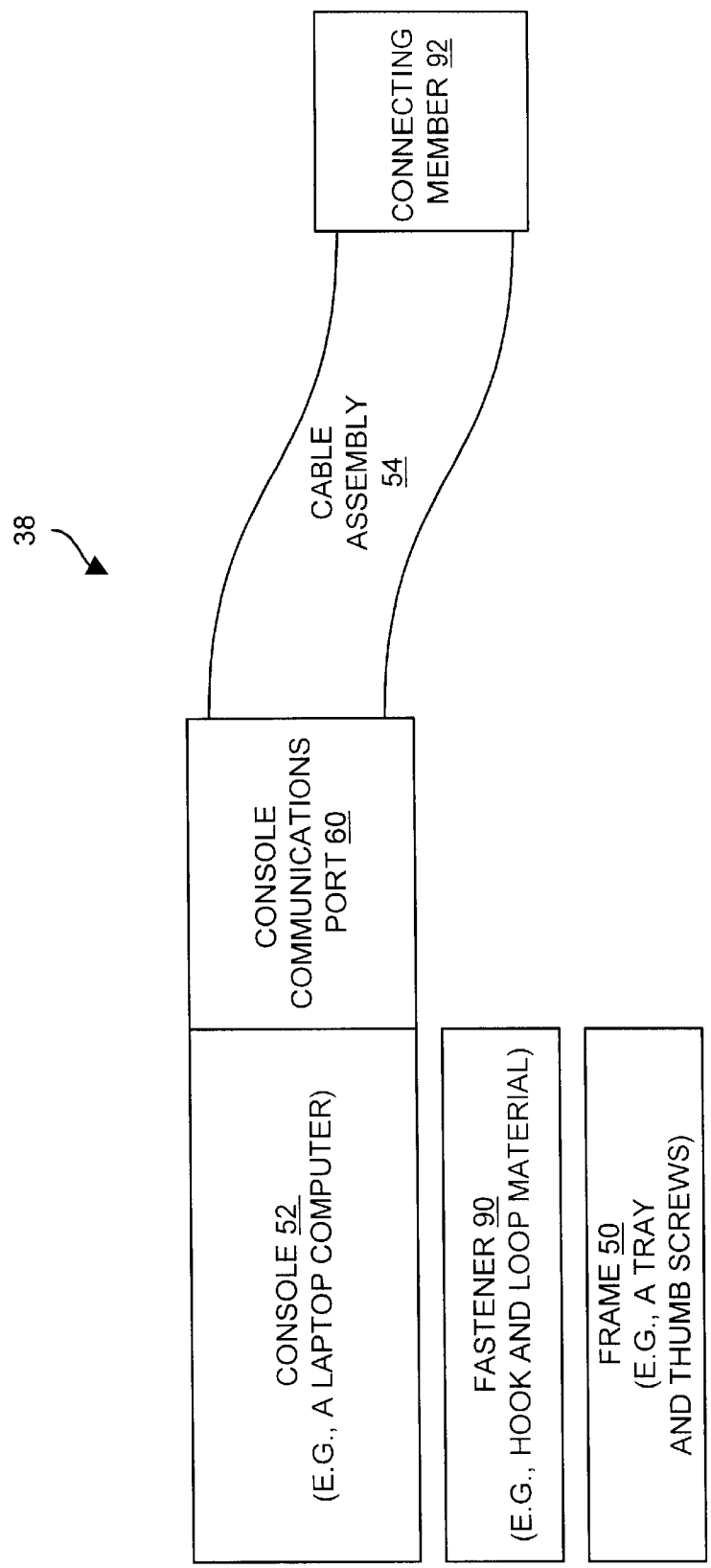
FIG. 4 shows a block diagram of the interface apparatus of FIG. 2.

FIG. 4 shows a block diagram of the interface apparatus 38. As mentioned earlier, the interface apparatus 38 includes the frame 50, the console 52, and the cable assembly 54. In one arrangement, the interface apparatus 38 further includes a fastener 90 (e.g., hook and loop material) that fastens the console 52 to the frame 50. The cable assembly 54 houses a set of cables that attach, at a set of first ends, to the console communications port 60 of the console 52. A set of second ends of the set of cables of the cable assembly 54 attaches to a connecting member 92 which holds the set of second ends together to form a standard interface (e.g., an arrangement of connectors) that mates with the computerized circuitry communications port 42 (also see FIG. 2). The shape of the cable assembly 54 is curved to illustrate that the cable assembly 54 is flexible (e.g., is movable within the X-Y plane). Further details of the invention will now be provided with reference to FIGS. 5 and 6.

Figure 5:
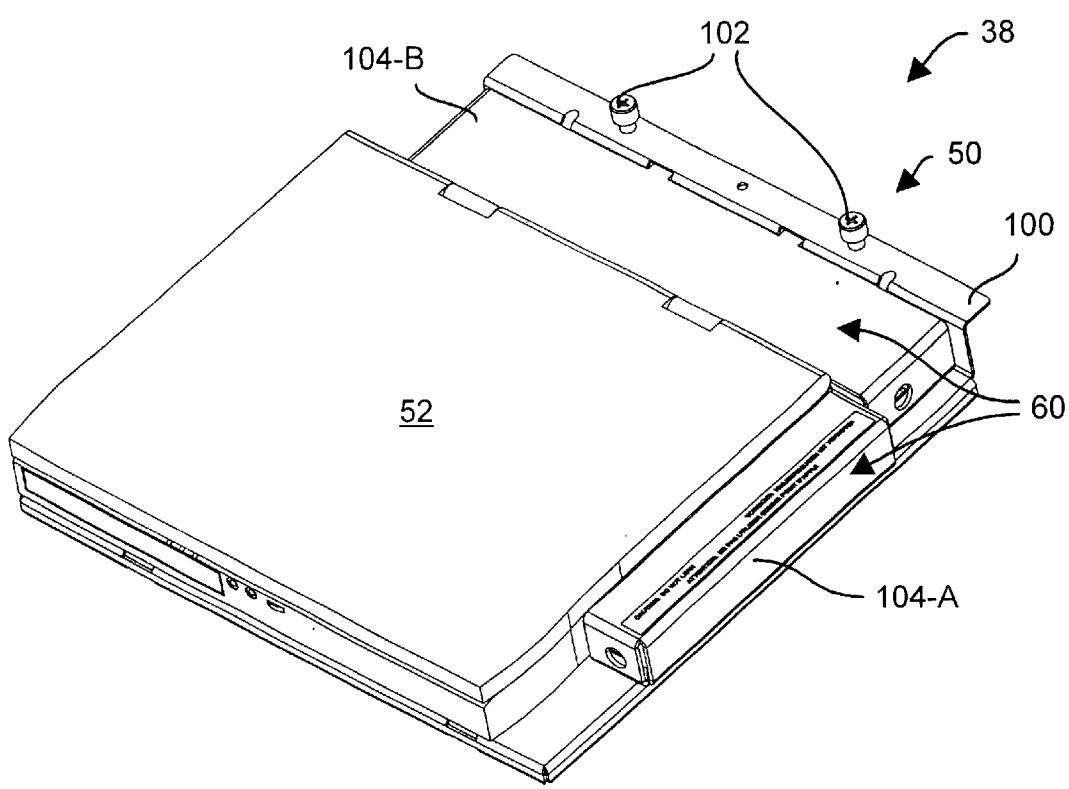
FIG. 5 shows a perspective view of a portion of the interface apparatus of FIG. 2.
Figure 6:
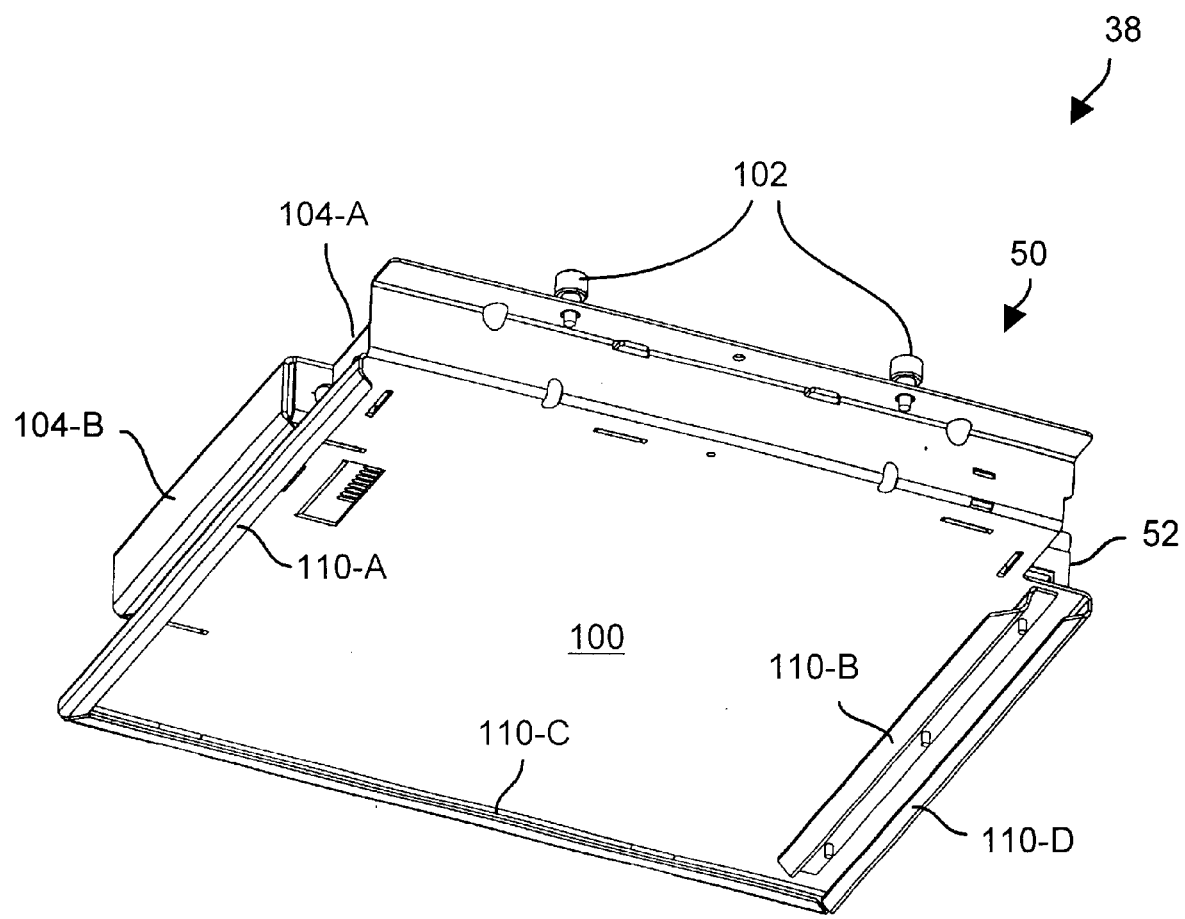
FIG. 6 shows another perspective view of the portion of the interface apparatus of FIG. 2.

FIG. 5 shows an overhead perspective view of a portion of the interface apparatus 38, and FIG. 6 shows an underneath perspective view of that portion. The portion includes the frame 50 and the console 52. By way of example only, the console 52 is shown in a compacted position (e.g., folded down or closed). The frame 50 includes a tray 100 and a set of thumb screws 102 (i.e., threaded members). After a user engages the interface apparatus 38 with the hinged platform 62 by sliding the frame 50 around the hinged platform 62, the user can thread the thumb screws 102 into the set of holes 86 (see FIG. 3) defined in the hinged platform 62 (e.g., turn the thumb screws 102 by hand) in order to lock the interface apparatus 38 with the hinged platform 62. The user must then turn the thumb screws in the opposite direction to unlock the interface apparatus 38 from the hinged platform 62. Accordingly, the user can manipulate the thumb screws to lock the tray 100 with and unlock the tray 100 from the hinged platform 62 of the interface mounting portion 34 of the chassis 24.

As shown in FIG. 5, the interface apparatus 38 further includes a set of shields 104-A, 104-B (e.g., plastic covers) which protect portions of the console communications port 60 (e.g., a D-Subminiature connector, a power connector, etc.). In particular, the set of shields 104-A, 104-B helps protect the set of cable ends of the cable assembly 54 and the console communications port 60 against damage (e.g., against tampering, dirt and debris, etc.). In one arrangement, the shields 104-A, 104-B are formed of plastic (e.g., smoked or partially transparent plastic) and fasten into grooves (e.g., slots) of the tray 100 in order to cover the console communications port 60 of the console 52.

As shown in FIG. 6, the tray 100 defines a set of channels (or grooves) 110-A, 110-B, and 110-C (collectively, channels 110) along the periphery of the tray 100 for engaging the hinged platform 62 (also see FIG. 3). In one arrangement, the tray 100 is substantially wider than the hinged platform 62 (e.g., by 0.5 to 1.0 inches wider) requiring one of the channels 110 (e.g., the channel 110-B) to reside a short predetermined distance from the edge of the tray 100. In this arrangement, the tray 100 preferable includes another outer edge 110-D (see FIG. 6) enabling the supplier of the interface apparatus 38 to more easily reconfigure the components of the interface apparatus 38 in response to different configurations for the console 52. For example, suppose the manufacturer of the consoles 52 uses new console configurations in which particular connectors of the console communications port 60 are moved from their original locations. The supplier of the interface apparatus 38 may be able to shift how the tray 100 mounts to the hinged table 62 (also see FIG. 3) so that no modifications are required for the cable harness. For example, the supplier can modify how the tray 100 mounts with the hinged table 62 by forming the channel 110-B a short predetermined distance from the opposite edge (e.g., adjacent the channel 110-A) so that a new set of channels 110-B, 110-C and 110-D are used when engaging the interface apparatus 38 with the hinged platform 62 rather than the original set of channels 110-A, 110-B and 110-C. Further details of the invention will now be provided with reference to FIG. 7.

Figure 7:
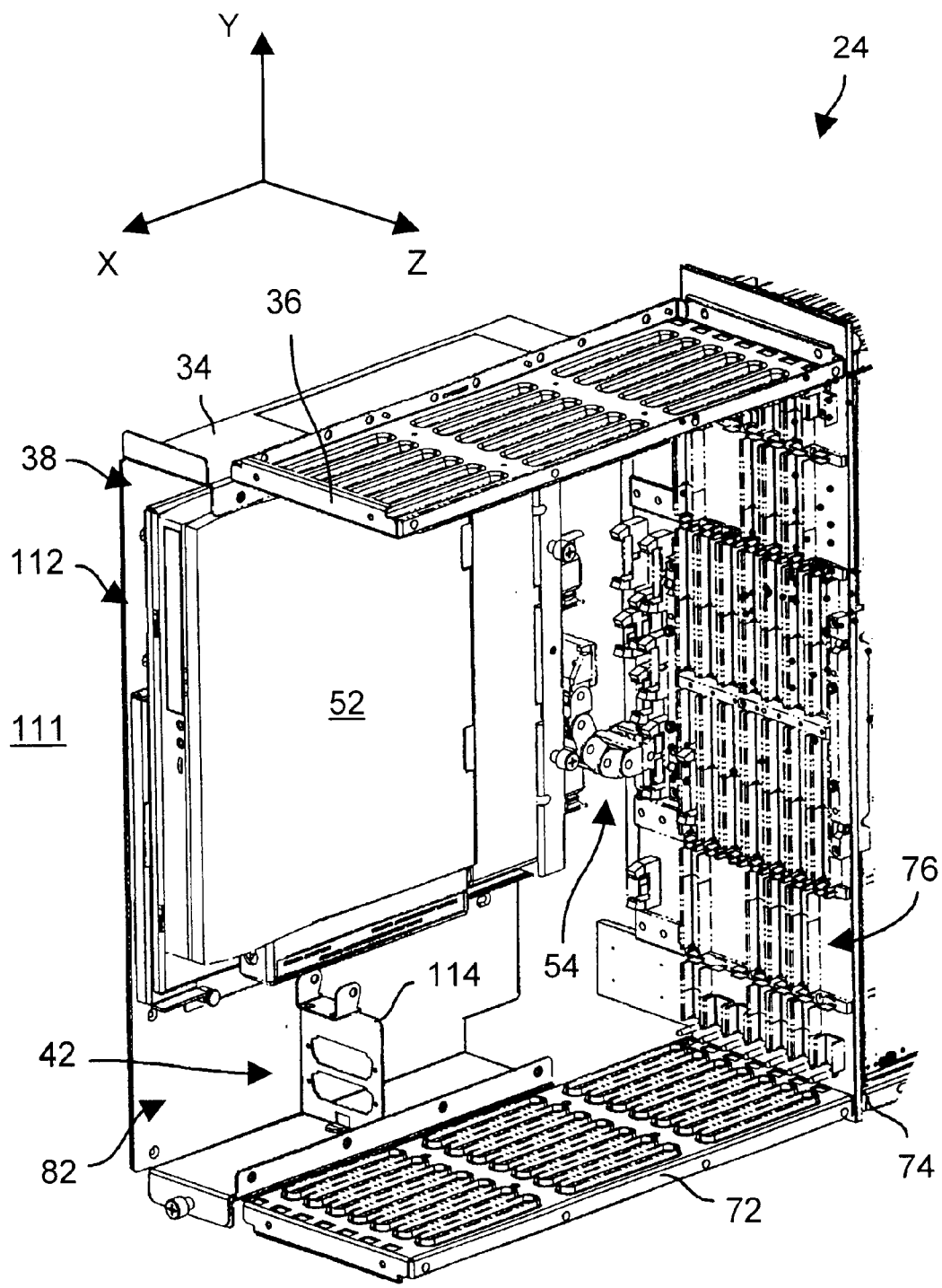
FIG. 7 shows a perspective view of the interface apparatus when in a storage location within a cavity of the chassis of FIG. 3.

FIG. 7 shows a perspective view of the interface apparatus 38 when moved from an operating location 111 external to the chassis 24 to a storage location 112 within the central cavity 82 defined by the chassis 24. As shown, the interface apparatus 38 resides within the interface mounting portion 34 of the chassis 24 rather than either the circuit mounting portion 36 of the chassis 24 or the cabinet door 28. This design is well-suited for configurations where the interface apparatus 38 is wider than the cabinet door 28 or too deep to fit within the cabinet door 28.

As shown in FIG. 7, the cable assembly 54 flexes back in the card cage 72 toward the backplane 74 rather than stray in the Z direction. In one arrangement, the connecting member 92 (see FIG. 4), which holds the ends of the cable assembly 54 together to form a standard interface (e.g., an arrangement of connectors) for mating with the computerized circuitry communications port 42 (also see FIG. 2), resides deep into the card cage 72 near the backplane 74 as well.

In an alternative arrangement, the computerized circuitry communications port 42 and the connecting member 92 at the end of the cable assembly 54 mate at a location nearer the outer opening of the card cage 72 such as at a bracket 114 defined by the chassis 24 as also shown in FIG. 7. Accordingly, the supplier of the computerized system 20 (e.g., the manufacturer) can electrically connect and disconnect the interface apparatus 38 by mating and un-mating the connecting member 92 (i.e., the end of the cable assembly 54) at the bracket 114 (e.g., at a standardized connecting interface) rather than wrestle with how the other end of the cable assembly 54 connects with the particular connector configuration of the console 52 (e.g., a laptop computer).

Figure 8:
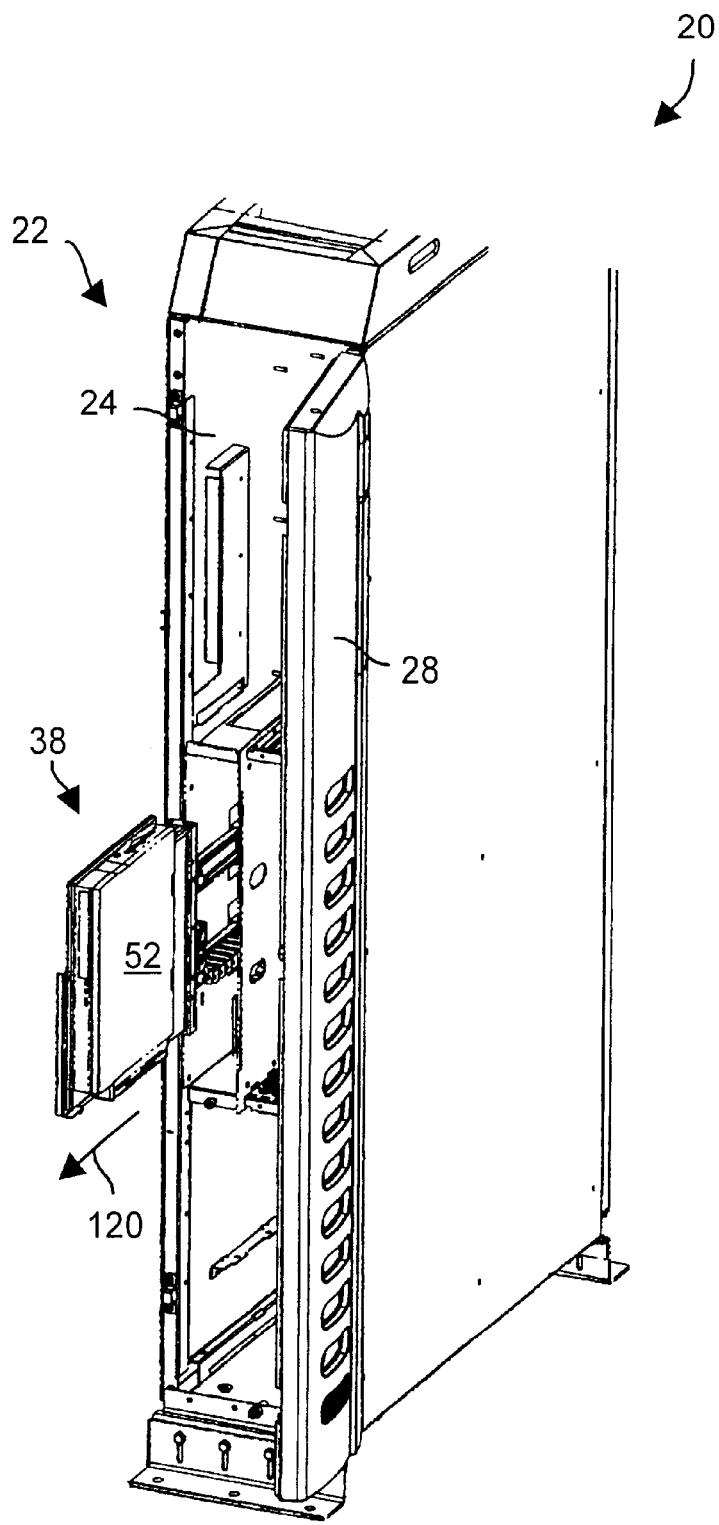
FIG. 8 shows a perspective view of the interface apparatus when partially removed from the storage location of FIG. 7.

FIG. 8 shows a perspective view of the interface apparatus 38 when partially removed from its storage location 112 of FIG. 7. As shown, the interface apparatus 38 withdraws from within the cabinet 22 in a direction 120 when the cabinet door 120 is open.

Figure 9:
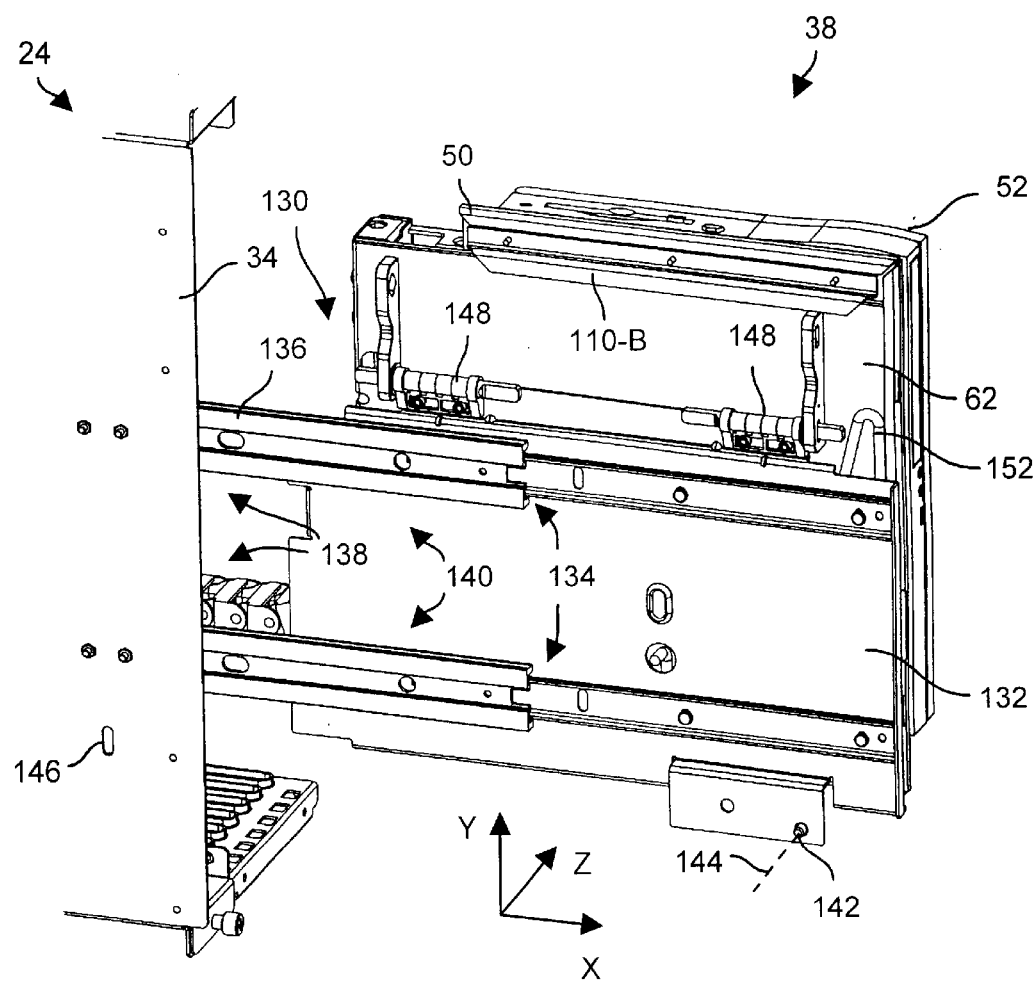
FIG. 9 shows another perspective view of the interface apparatus when partially removed from the storage location of FIG. 7.

FIG. 9 shows another perspective view of the interface apparatus 38 when the interface apparatus 38 is partially removed from the storage location 112 of FIG. 7. As shown in FIG. 9, the interface mounting portion 34 of the chassis 24 includes a support apparatus 130 having a vertically-oriented plate 132 and a set of guides 134 that enable the plate 132 to slide in and out of the central cavity 82 defined by the interface mounting portion 34 of the chassis 24. Each guide 134 includes a movable rail 136 that moves relative to a fixed rail 138 which is held within the chassis 24. In one arrangement, each guide further includes a set of rollers 140 (e.g., wheels, and shown generally as arrow 140) which are disposed between the movable rail 136 and the fixed rail 138 to enable the movable rail 136 to slide more easily relative to the fixed rail 138 (e.g., to lower friction between the movable rail 136 and the fixed rail 138). That is, the rollers 140 can reduce friction between the movable rail 136 and fixed rail 138 thus making it easier to setup or put away the interface apparatus 38 (i.e., remove the interface apparatus 38 from the central cavity 82 in order to operate the console 52, or place the interface apparatus 38 back in the central cavity 82).

As shown in FIG. 9, the support apparatus 130 further includes a plunger 142 which fastens to a section of the vertically-oriented plate 132. A user can move the plunger 142 along a direction 144 (e.g., the Z direction). In particular, when the interface apparatus 38 resides in the storage location 112 (also see FIG. 7), the plunger 142 engages a hole 146 defined in the interface mounting portion 34 of the chassis 24 thus holding the movable rail 136 of each guide 134 in a locked position. The user moves (e.g., pulls) the plunger 142 in the direction 144 to release the movable rails 136 and then slides the interface apparatus 38 (e.g., along the X-Y plane) to the partially removed position shown in FIG. 9. The plunger 142 can prevent the interface apparatus 38 from inadvertently sliding out of the central cavity 82 (e.g., if the cabinet door 28 is accidentally left open).

As shown further in FIG. 9, the interface mounting portion 34 additionally includes a set of friction hinges 148 that physically couples the hinged platform 62 to the support apparatus 130. In particular, the friction hinges 148 couple the hinged platform 62 to the vertically-oriented plate 132. The friction hinges 148 enable the hinged platform to rotate about the X-axis as shown in FIG. 9. Additionally, the friction hinges 148 suppress rotation of the hinged platform 62 due to gravity. Accordingly, the hinged platform 62 (as well as the interface apparatus 38 fastened thereto) can be prevented from inadvertently falling and sustaining damage (e.g., slamming against part of the cabinet). Further details of the invention will now be provided with reference to FIGS. 10 and 11.

Figure 10:
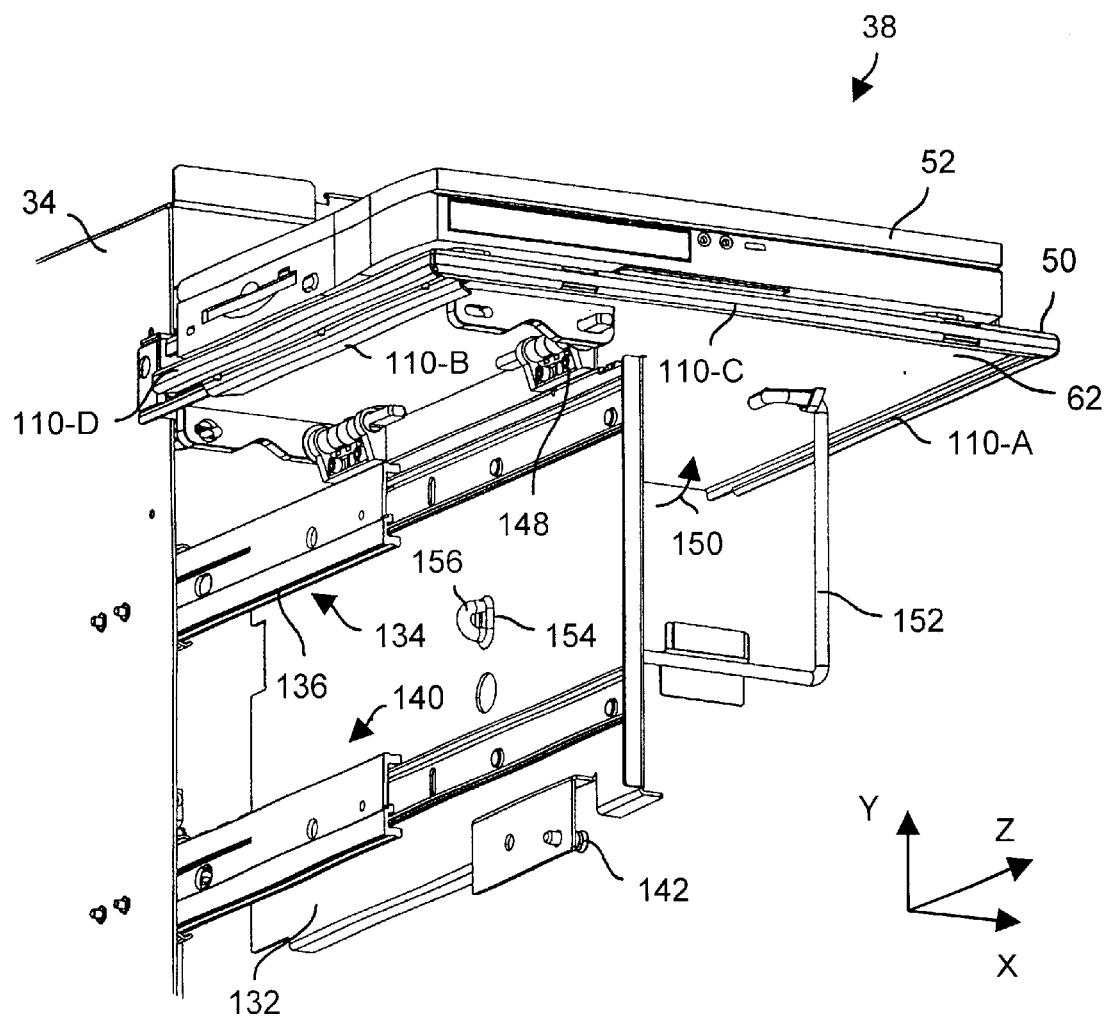
FIG. 10 shows a perspective view of the interface apparatus when in an operating location.
Figure 11:
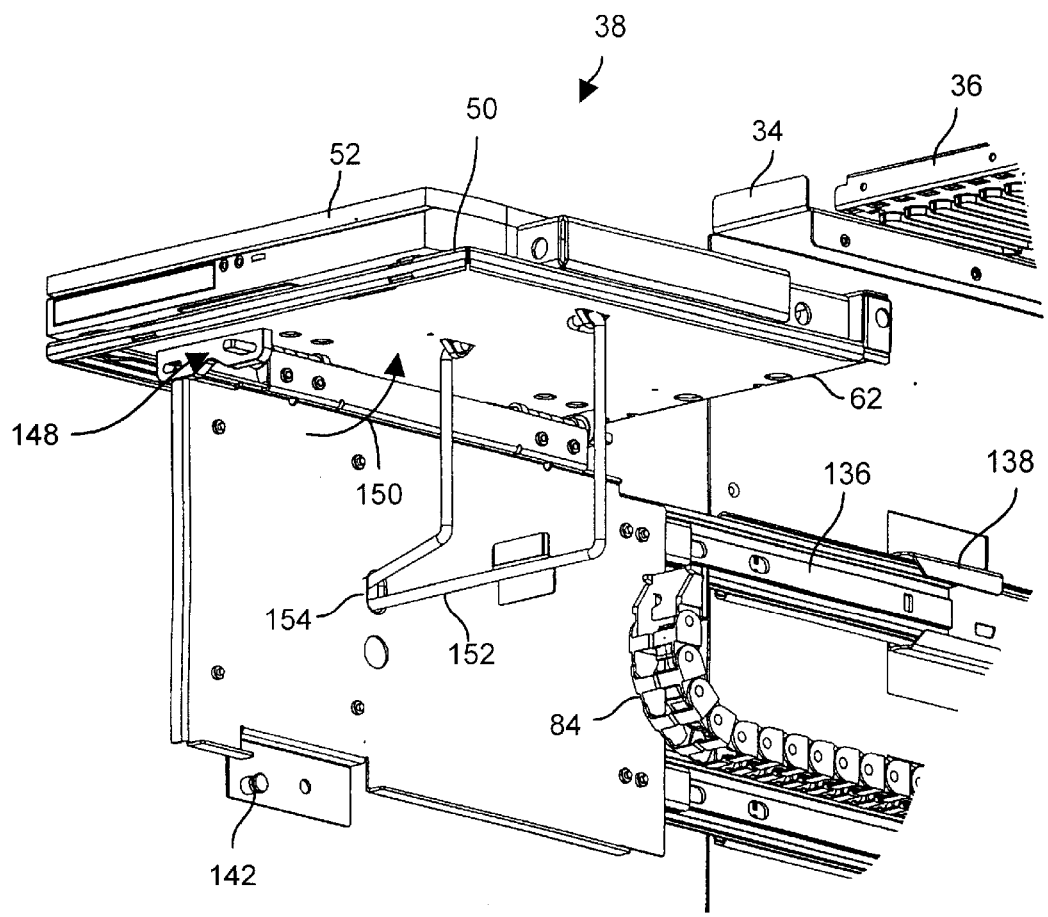
FIG. 11 shows another perspective view of the interface apparatus when in the operating location.

FIGS. 10 and 11 show perspective views of the interface apparatus 38 when in the operating position. As shown, hinged platform 62 unfolds in a direction 150 about the friction hinges 148 around the X-axis. When the hinged platform 62 is rotated slightly beyond being perpendicular to the vertically-oriented plate 132 (e.g., 100 to 110 degrees), the user unfolds a bar 152 that fastens to the hinged platform 62 and then moves the hinged platform 62 such that it is substantially perpendicular to the vertically-oriented plate 132. That is, the bar 152 initially resided between the hinged platform 62 and the vertically-oriented plate 132 (see FIG. 9). However, when the bar 152 is unfolded from the hinged platform 62, a capture region 154 (e.g., a hole defined by vertically-oriented plate 132) captures an end 154 of the bar 152 such that the bar 152 supports the hinged platform 62 relative to the vertically-oriented plate 132 at a substantially 90 degree angle. Thus, when the interface apparatus 38 is in the operating position, the vertically-oriented plate 132 is substantially in the X-Y plane, the bar 152 is substantially in the Y-Z plane, and the hinged platform 62 is substantially in the X-Z plane. Accordingly, the bar 152 provides additional support for the hinged platform 62 preventing the hinged platform 62 from moving (e.g., while a user types on the input device).

It should be understood that even without the bar 152, the friction hinges 148 hold the hinged platform 62, as well as the interface apparatus 38 attached thereto, in fixed positions relative to the vertically-oriented plate 132. In particular, the friction hinges 148 are configured to suppress rotation of the hinged platform 62 and the interface apparatus 38 thus preventing the hinged platform 62 and the interface apparatus 38 from slamming against the plate 132 when the bar is not in place to support the hinged platform 62 in order to avoid inadvertently damaging the interface apparatus 38. When the bar 152 is in place to support the hinged platform 62, the bar 152 provides additional stability, e.g., enables the user to type on a keyboard or use a touch pad of the console 52 without allowing the hinged platform 62 to inadvertently rotate.

Figure 12:
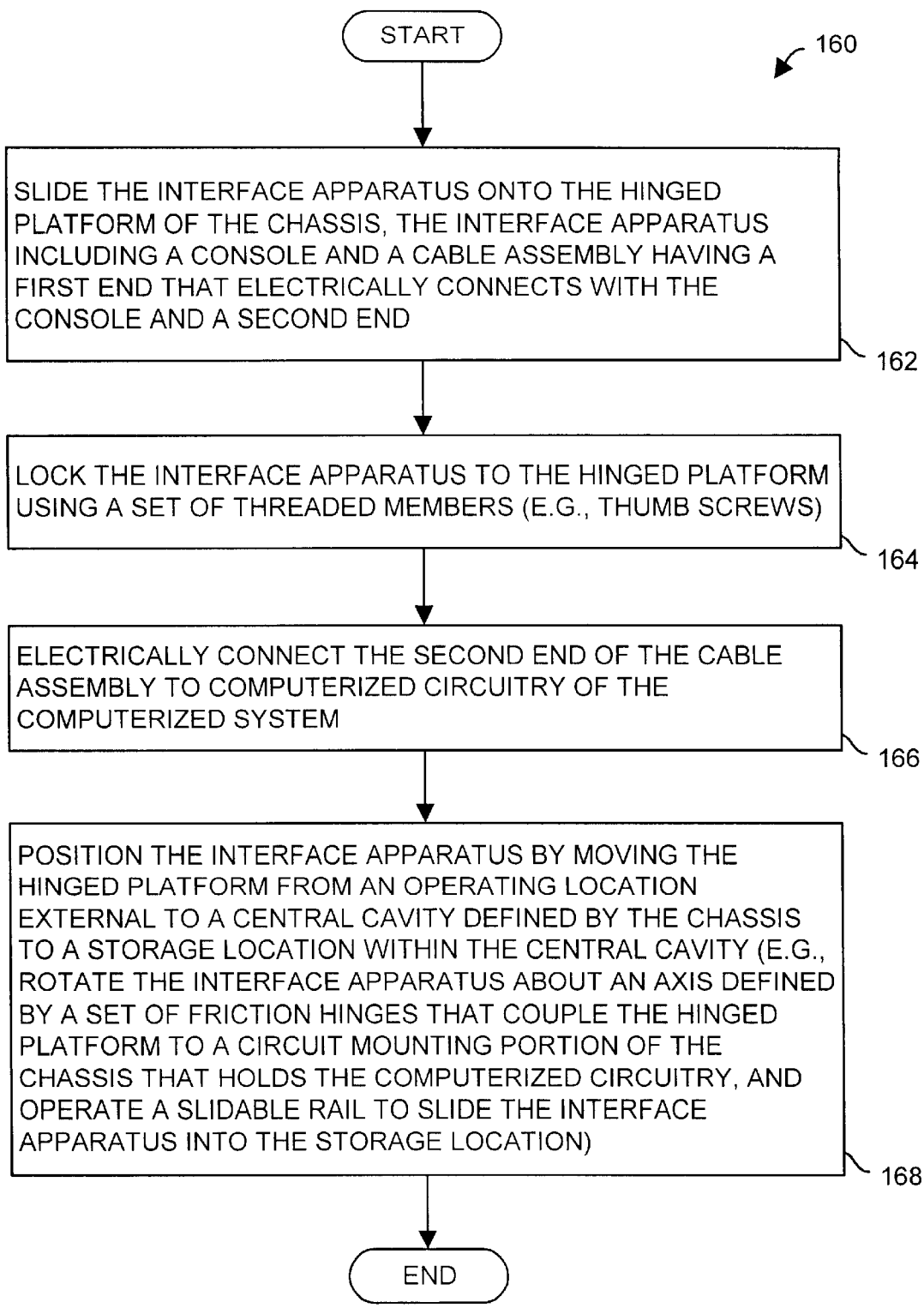
FIG. 12 show a procedure which is performed by a user of the computerized system of FIG. 1.

FIG. 12 shows a procedure 160 which is performed by a user of the computerized system of FIG. 1 to install the interface apparatus 38. It should be understood that, prior to performing the procedure 160, any original interface apparatus 38 has been removed (e.g., by simply disconnecting the end of the cable assembly 54 from the computerized circuitry communications port 42, undoing the thumb screws 102 to unlock the interface apparatus 38 from the hinged platform 62, and sliding the interface apparatus 38 off of the hinged platform 62).

In step 162, the user slides the interface apparatus 38 onto the hinged platform 62 of the chassis 24. In particular, the user engages the channels 110 of the frame 100 around the hinged platform 62. The user does not need to awkwardly handle re-hinging a small table to a cabinet door as in the earlier-described conventional system. Accordingly, the user can take only a few seconds to perform step 162, rather than many minutes in the earlier-described conventional system.

In step 164, the user locks the interface apparatus 38 to the hinged platform 62 using a set of threaded members. In particular, the user simply turns the thumb screws 102 of the frame 100 (e.g., by hand) into the set of holes 86 of the hinged platform 62 thus securing the interface apparatus 38 to the hinged platform 62. Step 164 requires only a few seconds to perform.

In step 166, the user electrically connects the end of the cable assembly 54 to the computerized circuitry communications port 42 (see FIG. 2). In particular, the user plugs in the connecting member 92 (see FIG. 4) of the interface apparatus 38 into the computerized circuitry communications port 42. Again, step 166 requires only a few seconds to perform. Even if the console 52 includes connector locations that are different than an original console 52, there are no cable ends that require substantial manipulating (e.g., moving in order to obtain slack, etc.) as in the above-described conventional system.

In step 168, the user positions the interface apparatus 38 within the computerized system 20 by moving the hinged platform 62 from the operating location 111 external to the central cavity 82 defined by the chassis 24 to the storage location 112 within the central cavity 82 (also see FIG. 7). In particular, the user rotates the interface apparatus 38 about an axis defined by the set of friction hinges 148 (e.g., the X-axis) that couple the hinged platform 62 to the circuit mounting portion 36 of the chassis 24, and operates the set of slidable rails 136 (i.e., guides 134) to slide the interface apparatus 38 into the storage location 112.

As described above, embodiments of the invention are directed to techniques for mounting an interface apparatus 38 (e.g., a laptop computer coupled to a frame) within an electronic cabinet. In particular, the interface apparatus 38 is configured to fasten to and detach from the hinged platform 62 (e.g., a small table). Accordingly, a user (e.g., an installer) does not need to unscrew a small table from its hinges in order to replace an original laptop computer as in the earlier-described conventional approach to replacing a laptop computer stored in an electronic cabinet. Rather, the user can simply detach the interface apparatus 38 from the hinged platform 62 (e.g., slide the laptop computer and frame off of the hinged platform), and fasten a new interface apparatus 38 in its place (e.g., slide a new laptop computer and new frame onto the hinged platform) thus minimizing installation time and effort. The features of the invention, as described above, may be employed in computational systems (e.g., data storage systems, general purpose computers, etc.), apparatus and procedures as well as other electronic components such as those of EMC Corporation of Hopkinton, Mass.

While this invention has been particularly shown and described with references to preferred embodiments thereof, it will be understood by those skilled in the art that various changes in form and details may be made therein without departing from the spirit and scope of the invention as defined by the appended claims.

For example, the interface apparatus 38 was described above as residing in the storage location 112 within the central cavity 82 defined by the chassis 24 by way of example only. Other storage locations are suitable for the interface apparatus 38 as well such as within a cabinet door (e.g., the interface apparatus 38 can mount to a hinged platform 62 stored in the cabinet door in a manner similar to that described above). Additionally, a user can bring a portably interface apparatus 38 and simply rest the interface apparatus 38 on the hinged platform 62. Significant time is still saved since the user can simply slide the frame 50 of the interface apparatus 38 around the hinged platform 62 and tighten the thumbs screws 102 thus avoiding having to re-hinge a small table as in the earlier-described conventional system.

Furthermore, it should be understood that the console 52 of the interface apparatus 38 was described above as being a laptop computer by way of example only. In other arrangements, the console 52 is a simply input/output (I/O) device (e.g., an electronic monitor).

What is claimed is:

1. A computerized system, comprising:
   (a) a chassis having a circuit mounting portion and an interface mounting portion, the interface mounting portion including a hinged platform;
   (b) computerized circuitry fastened to the circuit mounting portion of the chassis, the computerized circuitry having a computerized circuitry communications port; and
   (c) an interface apparatus having:
      (i) a frame that is configured to fasten to and detach from the hinged platform of the interface mounting portion of the chassis, the frame being configured to hang from the hinged platform in a substantially vertical direction when fastened to the hinged platform and when residing in a storage location within the chassis, and
      extend substantially horizontally along the hinged platform when fastened to the hinged platform and when residing in an operating location outside the chassis while fastened to the hinged platform,
      (ii) a console that attaches to the frame, the console including an input device, an output device and a console communications port, and
      (iii) a cable assembly having a first end that electrically connects with the console communications port and a second end that is configured to electrically connect with the computerized circuitry communications port.

2. The computerized system of claim 1 wherein the cable assembly of the interface apparatus includes:
   a set of cables having a set of first ends that electrically connects with the communications port of the console and a set of second ends that are configured to electrically connect with the computerized circuitry communications port; and
   a cable carrier that is configured to (i) hold a mid-section of the set of cables, (ii) permit the mid-section of the set of cables to move along an X-Y plane, and (iii) restrict movement of the mid-section of the set of cables along a Z direction that is substantially perpendicular to the X-Y plane.

3. The computerized system of claim 2 wherein the cable assembly of the interface apparatus further includes:
   a connecting member that holds the set of second ends of the set of cables, and is configured to concurrently mate each of the set of second ends with the computerized circuitry communications port.

4. The computerized system of claim 2 wherein the interface apparatus further includes:
   a set of shields that cover the set of first ends of the set of cables in order to protect the set of first ends of the set of cables against damage.

5. The computerized system of claim 1 wherein the interface mounting portion of the chassis further includes:
   a support apparatus that is physically coupled to the circuit mounting portion of the chassis; and
   a set of friction hinges that is physically couples the hinged platform to the support apparatus, the set of friction hinges being configured to suppress rotation of the hinged platform relative to the support apparatus.

6. The computerized system of claim 1 wherein the chassis defines a central cavity which houses the computerized circuitry, and wherein the interface mounting portion of the chassis includes:
   a support apparatus having a guide that includes (i) a fixed rail that is physically coupled to the circuit mounting portion of the chassis within the central cavity defined by the chassis, and (ii) a movable rail that moves relative to the fixed rail; and
   a set of hinges that physically couples the hinged platform to the movable rail to permit the console to selectively reside in a storage location within the central cavity defined by the chassis and an operating location outside the central cavity defined by the chassis.

7. The computerized system of claim 6 wherein the guide of the support apparatus further includes:
   a set of rollers disposed between the fixed rail and the movable rail to enable the movable rail to slide relative to the fixed rail.

8. The computerized system of claim 6 wherein the guide of the support apparatus further includes:
   a plunger, coupled to the movable rail, that selectively engages and disengages with the chassis to respectively hold the movable rail in a locked position and release the movable rail from the locked position.

9. The computerized system of claim 1 wherein the chassis defines a cabinet height, a cabinet width and a cabinet depth; wherein the console further includes a console housing that holds the input device, the output device and the console communications port; wherein the console housing has a console height, a console width and a console depth; and wherein the console width of the console housing is wider than the cabinet width defined by the chassis.

10. The computerized system of claim 1 wherein the chassis defines a chassis width in a direction that is parallel to a floor surface that supports the computerized system; wherein the console, when residing in the operating location outside the chassis, defines a console width in the direction that is parallel to the floor surface; and wherein the console width is greater than the chassis width.

11. The computerized system of claim 10 wherein the console is a laptop computer.

12. The interface apparatus of claim 11 wherein the console is a laptop computer.

13. A computerized system, comprising:
(a) a chassis having a circuit mounting portion and an interface mounting portion, the interface mounting portion including a hinged platform;
(b) computerized circuitry fastened to the circuit mounting portion of the chassis, the computerized circuitry having a computerized circuitry communications port; and
(c) an interface apparatus having:
(i) a frame that is configured to fasten to and detach from the hinged platform of the interface mounting portion of the chassis,
(ii) a console that attaches to the frame, the console including an input device, an output device and a console communications port, and
(iii) a cable assembly having a first end that electrically connects with the console communications port and a second end that is configured to electrically connect with the computerized circuitry communications port,
wherein the frame of the interface apparatus includes:
a tray that defines (i) a surface that attaches to the console, and (ii) a set of channels to slidably engage the tray with the hinged platform of the interface mounting portion of the chassis; and
a set of threaded members, coupled to the tray, to lock the tray with and unlock the tray from the hinged platform of the interface mounting portion of the chassis.

14. A computerized system, comprising:
(a) a chassis having a circuit mounting portion and an interface mounting portion, the interface mounting portion including a hinged platform;
(b) computerized circuitry fastened to the circuit mounting portion of the chassis, the computerized circuitry having a computerized circuitry communications port; and
(c) an interface apparatus having:
(i) a frame that is configured to fasten to and detach from the hinged platform of the interface mounting portion of the chassis,
(ii) a console that attaches to the frame, the console including an input device, an output device and a console communications port, and
(iii) a cable assembly having a first end that electrically connects with the console communications port and a second end that is configured to electrically connect with the computerized circuitry communications port,
wherein the chassis defines a central cavity which houses the computerized circuitry, and wherein the interface mounting portion of the chassis includes:
a support apparatus having a guide that includes (i) a fixed rail that is physically coupled to the circuit mounting portion of the chassis within the central cavity defined by the chassis, and (ii) a movable rail that moves relative to the fixed rail, and
a set of hinges that physically couples the hinged platform to the movable rail to permit the console to selectively reside in a storage location within the central cavity defined by the chassis and an operating location outside the central cavity defined by the chassis; and wherein the interface mounting portion of the chassis further includes a bar that fastens to the hinged platform and wherein the guide of the support apparatus further includes:
a plate coupled to the movable rail, the plate defining a capture region that captures a portion of the bar in order to stabilize the hinged platform relative to the chassis.

15. An interface apparatus for a computerized system, the interface apparatus comprising:
a frame that is configured to fasten to and detach from a hinged platform of the computerized system, the frame being configured to
hang from the hinged platform in a substantially vertical direction when, fastened to the hinged platform and when residing in a storage location within a chassis of the computerized system, and
extend substantially horizontally along the hinged platform when fastened to the hinged platform and when residing in an operating location outside the chassis while fastened to the hinged platform;
a console that attaches to the frame, the console including an input device, an output device and a communications port; and
a cable assembly having a first end that electrically connects with the communications port of the console and a second end that is configured to electrically connect with a communications port of the computerized system.

16. The interface apparatus of claim 15 wherein the cable assembly includes:
a set of cables having a set of first ends that electrically connects with the communications port of the console and a set of second ends that are configured to electrically connect with the communications port of the computerized system; and
a cable carrier that is configured to hold a mid-section of the set of cables, permit the mid-section of the set of cables to move along an X-Y plane, and restrict movement of the mid-section of the set of cables along a Z direction that is substantially perpendicular to the X-Y plane.

17. The interface apparatus of claim 16 wherein the cable assembly further includes:
a connecting member that holds the set of second ends of the set of cables, and is configured to concurrently mate each of the set of second ends with the communications port of the computerized system.

18. The interface apparatus of claim 16, further comprising:
a set of shields that cover the set of first ends of the set of cables in order to protect the set of first ends of the set of cables against damage.

19. The interface apparatus of claim 15 wherein the chassis of the computerized system defines a chassis width in a direction that is parallel to a floor surface that supports the computerized system; wherein the console, when residing in the operating location outside the chassis, defines a console width in the direction that is parallel to the floor surface; and wherein the console width is greater than the chassis width.

20. An interface apparatus for a computerized system, the interface apparatus comprising:
- a frame that is configured to fasten to and detach from a hinged platform of the computerized system;
- a console that attaches to the frame, the console including an input device, an output device and a communications port; and
- a cable assembly having a first end that electrically connects with the communications port of the console and a second end that is configured to electrically connect with a communications port of the computerized system, wherein the frame includes:
- a tray that defines (i) a surface that attaches to the console, and (ii) a set of channels to slidably engage the tray with the hinged platform of the computerized system; and
- a set of threaded members, coupled to the tray, to lock the tray with and unlock the tray from the hinged platform of the computerized system.

21. A method for installing an interface apparatus onto a computerized system having a chassis that defines a central cavity for housing computerized circuitry, the method comprising the steps of:
- sliding the interface apparatus onto a hinged platform of the chassis, the interface apparatus including a console and a cable assembly having a first end that electrically connects with the console and a second end;
- electrically connecting the second end of the cable assembly to the computerized circuitry of the computerized system; and
- positioning the interface apparatus by moving the hinged platform from an operating location external to the central cavity defined by the chassis of the computerized system to a storage location within the central cavity defined by the chassis of the computerized system, the console extending substantially horizontally along the hinged platform when residing in the operating location and hanging from the hinged platform in a substantially vertical direction when residing in the storage location.

22. The method of claim 21, further comprising the step of:
- locking the interface apparatus to the hinged platform using a set of threaded members.

23. The method of claim 21 wherein the step of positioning includes the step of:
- rotating the interface apparatus about an axis defined by a set of friction hinges that couple the hinged platform to a circuit mounting portion of the chassis that holds the computerized circuitry.

24. The method of claim 23 wherein a slidable rail couples the set of friction hinges to the circuit mounting portion of the chassis, and wherein the step of positioning further includes the step of:
- operating the slidable rail to slide the interface apparatus into the storage location within the central cavity defined by the chassis.

25. The method of claim 21 wherein the step of sliding includes the step of:
- orienting the console such that a console width of the console is greater than a chassis.

* * * * *